United States Patent
Kim

(10) Patent No.: US 11,462,698 B2
(45) Date of Patent: Oct. 4, 2022

(54) FLEXIBLE DISPLAY APPARATUS

(71) Applicant: SAMSUNG DISPLAY CO., LTD., Yongin-si (KR)

(72) Inventor: Jongseong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/252,104

(22) Filed: Aug. 30, 2016

(65) Prior Publication Data

US 2017/0062742 A1    Mar. 2, 2017

(30) Foreign Application Priority Data

Aug. 31, 2015 (KR) .................. 10-2015-0122789

(51) Int. Cl.
 *H01L 51/00* (2006.01)
 *H01L 51/52* (2006.01)

(52) U.S. Cl.
 CPC ...... *H01L 51/0097* (2013.01); *H01L 51/5253* (2013.01); *H01L 2251/5338* (2013.01); *Y02E 10/549* (2013.01)

(58) Field of Classification Search
 CPC .......... H01L 27/3244; H01L 51/0097; H01L 51/5237; H01L 51/00; H01L 51/52; H05K 1/028; H05K 1/185; H05K 2201/10128; H05K 3/4644; B32B 7/12; B32B 37/1292
 See application file for complete search history.

(56) References Cited

U.S. PATENT DOCUMENTS

| | | | |
|---|---|---|---|
| 2007/0031642 A1* | 2/2007 | Lee | B32B 3/30 428/172 |
| 2007/0062639 A1* | 3/2007 | Chang | G09F 7/12 156/291 |
| 2011/0052836 A1* | 3/2011 | Kim | H01L 51/52 428/1.1 |
| 2013/0169515 A1* | 7/2013 | Prushinskiy | H01L 51/56 345/55 |
| 2014/0183473 A1 | 7/2014 | Lee et al. | |
| 2014/0217373 A1 | 8/2014 | Youn et al. | |
| 2014/0217382 A1 | 8/2014 | Kwon et al. | |
| 2015/0021570 A1 | 1/2015 | Kim et al. | |
| 2015/0036300 A1 | 2/2015 | Park et al. | |

(Continued)

FOREIGN PATENT DOCUMENTS

| | | | |
|---|---|---|---|
| CN | 104538425 A | * | 4/2015 |
| CN | 104600208 A | | 5/2015 |

(Continued)

*Primary Examiner* — Maria V Ewald
*Assistant Examiner* — Daniel P Dillon
(74) *Attorney, Agent, or Firm* — Lewis Roca Rothgerber Christie LLP

(57) ABSTRACT

A flexible display apparatus may include a bending area at which the display panel may be configured to bend or fold around a bending axis, and non-bending areas extending from respective edges of the bending area, a support member on the display panel across the bending area and the non-bending areas, and may include a first protruding portion protruding away from the display panel at the bending area, and a cover member facing the display panel such that at least a portion of the support member may be between the display panel and the cover member.

7 Claims, 10 Drawing Sheets

(56) References Cited

U.S. PATENT DOCUMENTS

| | | | |
|---|---|---|---|
| 2015/0049428 A1* | 2/2015 | Lee | G06F 1/1652 |
| | | | 361/679.27 |
| 2015/0147532 A1* | 5/2015 | Nam | B32B 7/022 |
| | | | 428/172 |
| 2015/0227172 A1* | 8/2015 | Namkung | G06F 1/1643 |
| | | | 345/173 |
| 2015/0314561 A1* | 11/2015 | Kim | B32B 37/1292 |
| | | | 428/201 |
| 2015/0363030 A1* | 12/2015 | Nam | G06F 3/0412 |
| | | | 345/173 |
| 2016/0190216 A1* | 6/2016 | Yang | G01B 7/18 |
| | | | 257/91 |
| 2016/0359132 A1* | 12/2016 | Sun | H01L 51/0097 |

FOREIGN PATENT DOCUMENTS

| | | |
|---|---|---|
| KR | 10-2014-0085956 A | 7/2014 |
| KR | 10-2014-0099164 A | 8/2014 |
| KR | 10-2014-0099174 A | 8/2014 |
| KR | 10-2014-0118222 A | 10/2014 |
| KR | 10-2015-0010411 A | 1/2015 |
| KR | 10-2015-0014713 A | 2/2015 |
| KR | 10-2015-0043604 A | 4/2015 |

* cited by examiner

FLEXIBLE DISPLAY APPARATUS

CROSS-REFERENCE TO RELATED APPLICATION

This application claims priority to, and the benefit of, Korean Patent Application No. 10-2015-0122789, filed on Aug. 31, 2015, the entire contents of which are incorporated herein by reference in their entirety.

BACKGROUND

Field

Embodiments of the present invention relate to a flexible display apparatus.

Description of the Related Art

Display apparatuses are being replaced by thin, portable flat-panel display apparatuses. In recent years, flexible display apparatuses are becoming more popular among various types of flat-panel display apparatuses. There is also increasing application and use of flexible display apparatuses, which may be bent or folded by a user, or flexible display apparatuses, which may include bending or folding as part of a manufacturing process.

However, when the user bends or folds a flexible display apparatus, the bending or folding areas of the flexible display apparatus are vulnerable to stress, and the flexible display apparatus may be deformed, damaged, or may have its properties of flexibility reduced. As a result, repeated bending or folding the flexible display apparatus may decrease durability, and may restrict user convenience.

SUMMARY

The present invention provides a flexible display apparatus that may be configured to improve its durability and user convenience. Additional aspects will be set forth in part in the description that follows and, in part, will be apparent from the description, or may be learned by practice of the presented exemplary embodiments.

According to one or more embodiments, a flexible display apparatus includes a display panel including a bending area at which the display panel is configured to bend or fold around a bending axis, and non-bending areas extending from respective edges of the bending area, a support member on the display panel across the bending area and the non-bending areas, and including a first protruding portion protruding away from the display panel at the bending area, and a cover member facing the display panel such that at least a portion of the support member is between the display panel and the cover member.

A center of curvature corresponding to the bending area when the bending area is bent or folded may be closer to the display panel than the support member.

The display panel may further include a display unit therein, and both edges of a surface of the display panel may be configured to be bent or folded to face each other.

The first protruding portion may extend in a direction parallel to the bending axis.

The cover member may include a second protruding portion at the bending area corresponding to a shape of the first protruding portion.

The non-bending areas may include a first non-bending area and a second non-bending area, and the cover member may define a space between a first portion of the cover member at the first non-bending area and a second portion of the cover member at the second non-bending area of the display panel.

The first protruding portion may be configured to be inserted into the space.

A first portion of the support member at the bending area may be longer than a second portion of the display panel at the bending area in a direction crossing the bending axis.

According to one or more embodiments, a flexible display apparatus includes a display panel including a bending area configured to bend or fold around a bending axis, and non-bending areas extending from respective edges of the bending area, a support member on the display panel across the bending area and the non-bending areas defining a groove portion at the bending area, and a cover member facing the display panel such that at least a portion of the support member is between the display panel and the cover member.

The support member may include an adhesive layer defining the groove portion.

A center of curvature in the bending area when the display panel is bent or folded may be closer to the display panel than the support member.

The display panel may further include a display unit therein, and both edges of a surface of the display panel may be configured to be bent or folded to face each other.

The groove portion may extend in a direction parallel to the bending axis.

The non-bending areas of the display panel may include a first non-bending area and a second non-bending area, and the cover member may define a space between a first portion of the cover member at the first non-bending area and a second portion of the cover member at the second non-bending area.

The groove portion may overlap the space.

A first portion of the support member at the bending area may be longer than a second portion of the display panel at the bending area in a direction crossing the bending axis.

BRIEF DESCRIPTION OF THE DRAWINGS

These and/or other aspects will become apparent and more readily appreciated from the following description of embodiments, taken in conjunction with the accompanying drawings, in which.

DETAILED DESCRIPTION

Figure 1:
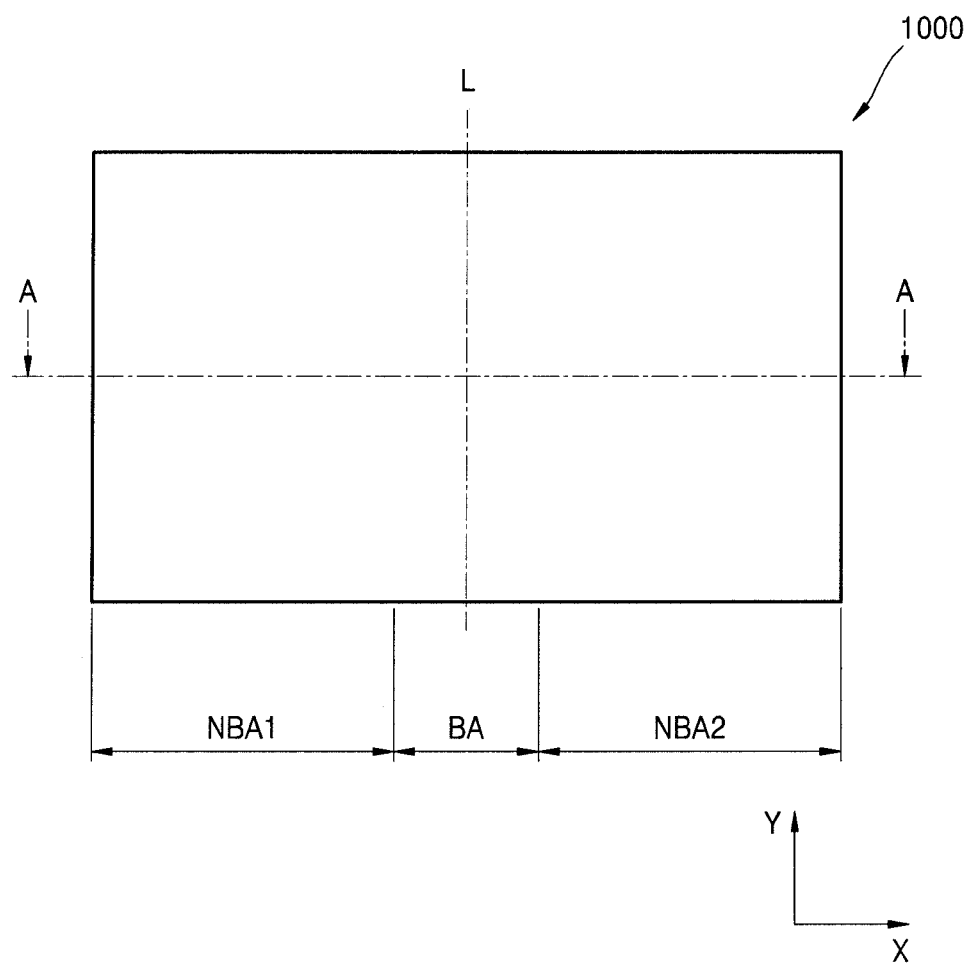
FIG. 1 is a schematic plan view of a flexible display apparatus according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
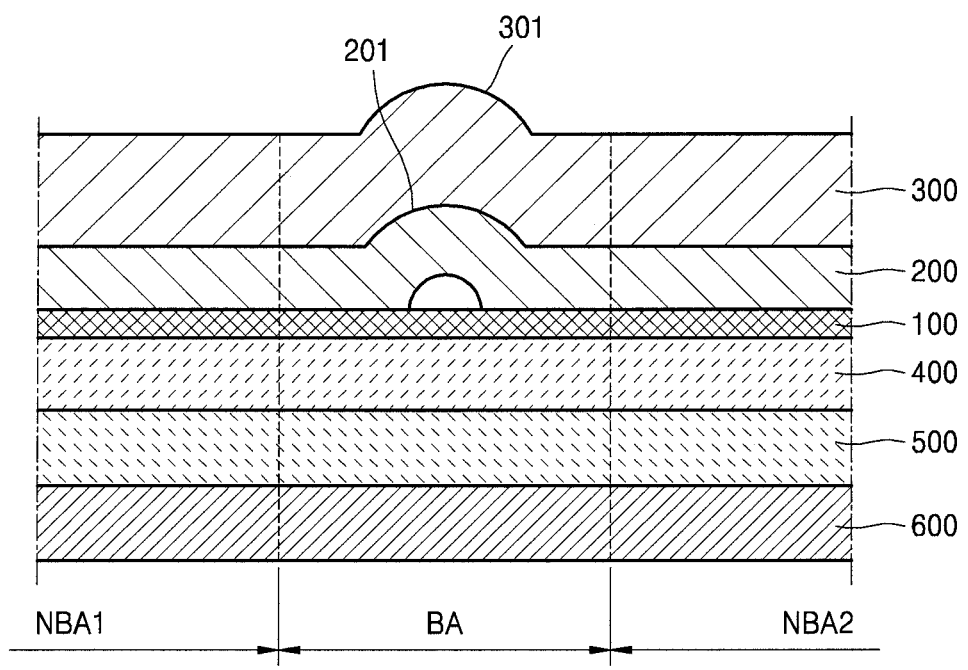
FIG. 2 is a cross-sectional view taken along the line A-A of FIG. 1.

FIG. 1 is a schematic plan view of a flexible display apparatus according to an embodiment, and FIG. 2 is a cross-sectional view taken along the line A-A of FIG. 1.

Referring to FIGS. 1 and 2, a flexible display apparatus 1000 may include a display panel 100, a support member 200 and a cover member 300. In another embodiment, on the opposite side of a surface on which the support member 200 and the cover member 300 of the display panel 100 are located, a touch panel 400, a polarizer 500, and a window unit 600 may be located.

The touch panel 400 may sense a touch of a user by sensing an incident amount of external light changed by the touch of the user. The polarizer 500, which may improve the efficiency of light emitted from an organic emission layer, is provided in the display panel 100. The window unit 600 may protect the display panel 100 from external shock and scratches, which might occur while being used.

However, a configuration of the display panel 100 is not necessarily limited to an embodiment shown in FIG. 2, and various functional layers may be configured on one or both sides of the display panel 100.

As shown in FIG. 1, the display panel 100 of the flexible display apparatus 1000 may include a bending area (BA) and a non-bending area(s) (NBA1, NBA2). The bending area (BA) of the display panel 100 may include a bending axis (L), and accordingly the bending area (BA) of the display panel 100 may be bent or folded around the bending axis (L).

The non-bending area(s) (NBA1, NBA2) of the display panel 100 may be respectively extended from each edge of the bending area (BA). According to an exemplary embodiment, the non-bending areas (NBA1, NBA2) may be divided into a first bending area (NBA1) and a second bending area (NBA2) with the bending area (BA) at the center. At least a portion of the non-bending areas (NBA1, NBA2) may be formed flat to make it easy to display an image created by the display panel 100, although the present invention is not limited thereto. According to an embodiment, the non-bending areas (NBA1, NBA2) may bend less than the bending area (BA) while having a partially curved shape.

The display panel 100 may include a display unit that displays an image, and that may include a plurality of display devices and thin film transistors. A specific structure of the display panel 100 will be explained later with reference to FIG. 10.

As shown in FIG. 1, a y-direction may mean a direction parallel to the bending axis (L), and an x-direction may cross the y-direction. In some embodiments, the x-direction may be a direction perpendicular to the y-direction. This also applies to embodiments and their modified embodiments, which will be explained later.

The support member 200 may be across the bending area (BA) and the non-bending area (NBA) of the display panel 100. The support member 200 may be on the display panel 100 on the opposite side of the surface on which the display unit of the display panel 100 is formed.

A portion of the support member 200, which is in the bending area (BA) of the display panel 100, may include a first protruding portion 201. The first protruding portion 201 may protrude away from the display panel 100 in the bending area (BA) of the display panel 100. The first protruding portion 201 may extend along the y-direction (i.e., in a direction parallel to the bending axis (L)).

The support member 200 may include a plurality of layers. In some embodiments, the support member 200 may include a base film, or an adhesive layer laminated over the base film, as explained in detail later with reference to the embodiments illustrated in FIG. 6 through FIG. 9.

The support member 200 may protect a surface of the display panel 100 adjacent the support member 200, and may support the display panel 100.

The cover member 300 may face the display panel 100. The support member 200 may be between the cover member 300 and the display panel 100. A portion of the cover member 300, which is in the bending area (BA) of the display panel 100, may include a second protruding portion 301. The second protruding portion 301 may correspond to a shape of the first protruding portion 201 of the support member 200. Accordingly, the second protruding portion 301 may protrude away from the display panel 100 in the bending area (BA) of the display panel 100, and may extend in a direction parallel to the bending axis (L).

The cover member 300 may protect the display panel 100 from external shock, and may improve the durability of the display panel 100. The cover member 300 may also serve as a housing in which the display panel 100 and the support member 200 are installed. According to an embodiment, the cover member 300 may span across an entirety of the display panel 100. However, the invention is not limited to the specific embodiment herein illustrated and described, and may be formed in various shapes depending on design parameters, as in some embodiments explained later.

The support member 200 and the cover member 300 may include a material having flexible properties so that the display panel 100 bends or folds easily.

Figure 3:
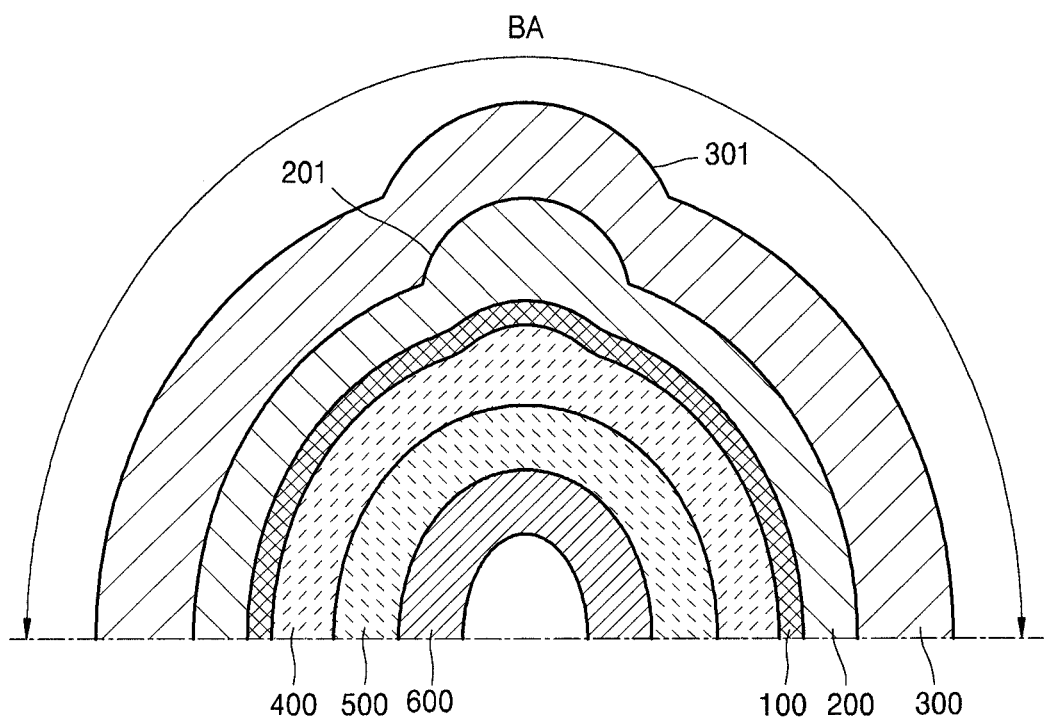
FIG. 3 is a cross-sectional view of a portion of the flexible display apparatus while being bent.

FIG. 3 is a cross-sectional view of a portion of the flexible display apparatus shown in FIG. 2, while being bent.

When the flexible display apparatus 1000 is bent or folded around the bending axis (L), as shown in FIG. 1, the bending area (BA) of the display panel 100 may have a protruding curved shape, as shown in FIG. 3. In this case, the bending axis (L) may be in an area of the bending area (BA) in which the first protruding portion 201 of the support member 200 and the second protruding portion 301 of the cover member 300 are included.

Referring to FIG. 3, the bending area (BA) of the display panel 100 may bulge toward, or may bow outward, in a direction toward the cover member 300 when the flexible display apparatus 1000 is bent or folded. As a result, both edges of the surface, in which the display unit of the display panel 100 is formed, may face each other. When the bending area (BA) of the display panel 100 bends or folds, a center of curvature in the bending area (BA) of the display panel 100 may be closer to the display panel 100 than the support member 200.

As shown in FIG. 3, when the flexible display apparatus 1000 is bent or folded at the bending area (BA) of the display panel 100 around the bending axis (L), the biggest bending-produced deformation may occur at the first protruding portion 201 of the support member 200 and at the second protruding portion 301 of the cover member 300. When stress caused by the bending concentrates on a small area, the support member 200 and the cover member 300 may be damaged, which may lead to shock and damage to the display panel 100. In the case of a structure shown in FIG. 3, the first protruding portion 201 of the support member 200 and the second protruding portion 301 of the cover member 300 may be subject to tensile stress.

However, because the first protruding portion 201 and the second protruding portion 301 have a protruding shape that protrudes outward, and because the display panel 100 curves outward, stress applied to the support member 200 and to the cover member 300 may be reduced when the bending area (BA) of the display panel 100 bends or folds. In other words, because the first protruding portion 201 and the second protruding portion 301 are already formed in a similar shape to the way the display panel 100 folds or bends at the bending area (BA), the bending-produced deformation of the first protruding portion 201 and the second protruding portion 301 may decrease. Accordingly, it is possible to improve the durability of the display panel 100, which is supported and/or protected by the support member 200 and the cover member 300, by preventing damage to the support member 200 and the cover member 300 even when being deformed because of bending or folding.

Figure 4:
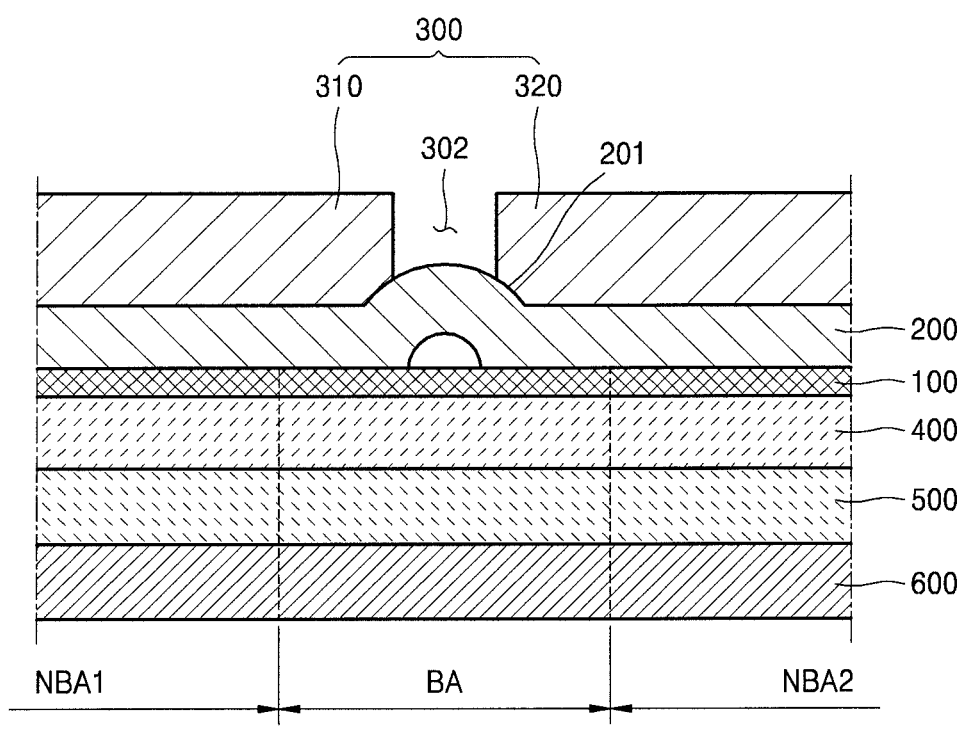
FIGS. 4 and 5 are cross-sectional views of a portion of the flexible display apparatus while not being bent and while being bent, according to another embodiment.
Figure 5:
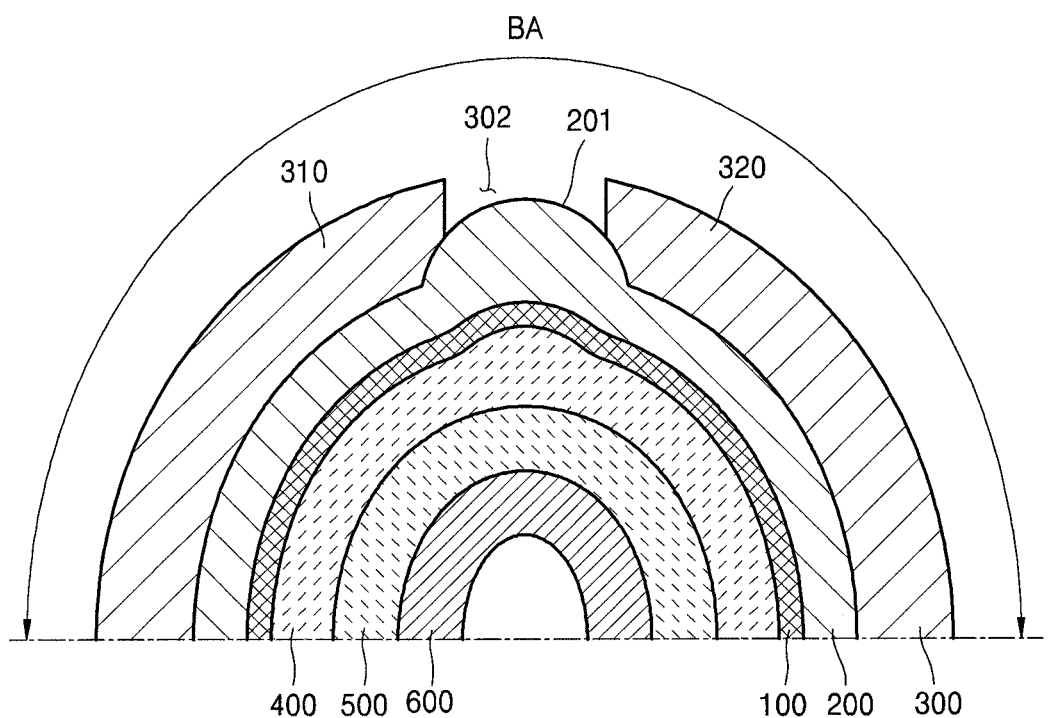

FIGS. 4 and 5 are cross-sectional views of a portion of the flexible display apparatus while not being bent and while being bent, respectively, according to another embodiment. Hereinafter, redundant descriptions given hereinbefore with reference to FIGS. 3 and 4 are omitted. This also applies to embodiments and their modified embodiments, as explained later.

Referring to FIG. 4, a portion of the support member 200 that is at the bending area (BA) of the display panel 100 may include the first protruding portion 201. The first protruding portion 201 may protrude away from the display panel 100 in the bending area (BA) of the display panel 100.

However, unlike the previous embodiments described with reference to FIGS. 2 and 3, the cover member 300 may include a first cover member 310, which is in the first non-bending area (NBA1) of the display panel 100, and a second cover member 320, which is in the second non-bending area (NBA2) of the display panel 100. A space 302 may be provided between the first cover member 310 and the second cover member 320. As a result, the first protruding portion 201 of the support member 200 may be inserted into the space 302, which is an empty space between the first cover member 310 and the second cover member 320.

Referring to FIG. 5, when the flexible display apparatus 1000 is bent or folded at the bending area (BA) of the display panel 100 shown in FIG. 4 around the bending axis (L), the first protruding portion 201 of the support member 200 may bend or fold while being inserted into the space 302.

In this case, because the cover member 300 is not in the area of the space 302, where the deformation caused by bending or folding occurs most severely, the stress caused by the deformation of the cover member 300 may be eased, or reduced. Further, because the first protruding portion 201 of the support member 200 is not covered by the cover member 300 immediately below the space 302, the stress applied to the support member 200 may also be reduced.

As described above, in the previous embodiments described with reference to FIG. 2 through FIG. 5, the first protruding portion 201 may be in a portion of the support member 200, which is at the bending area (BA) of the display panel 100. In this embodiment of the present application, when the portion of the support member 200 that is at the bending area (BA) is referred to as a first portion, and when the bending area (BA) of the display panel 100 is referred to as a second portion, a length of the first portion being extended along the x-direction may be longer than a length of the second portion being extended along the x-direction. Further, the x-direction may cross a direction of the bending axis (L) (e.g., may perpendicularly cross the bending axis (L), as shown in FIG. 1).

Figure 6:
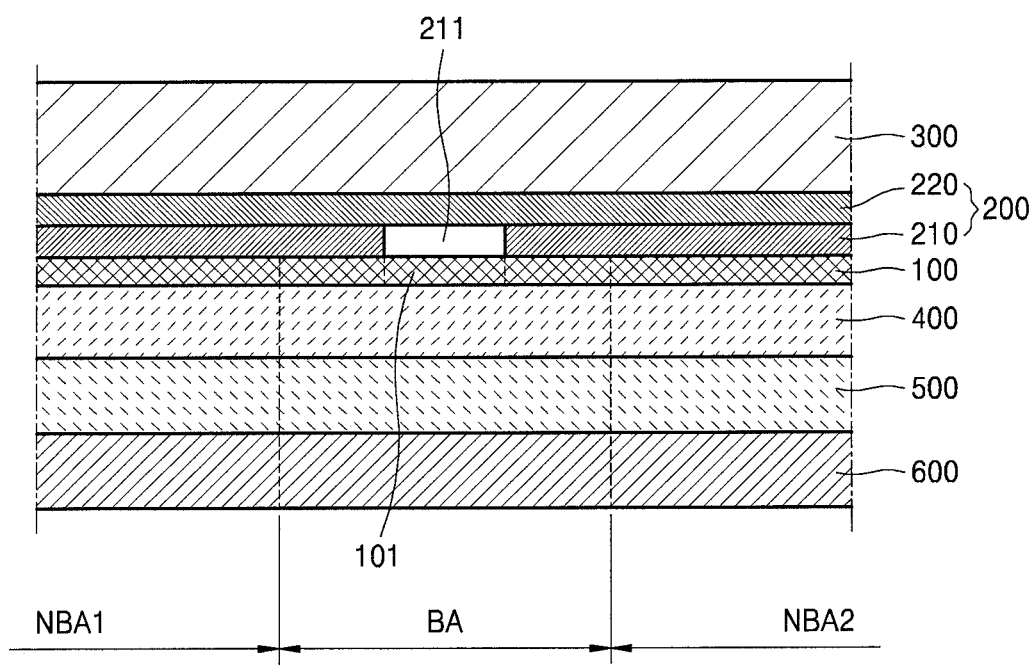
FIGS. 6 and 7 are cross-sectional views of a portion of the flexible display apparatus while not being bent and while being bent, according to yet another embodiment.
Figure 7:
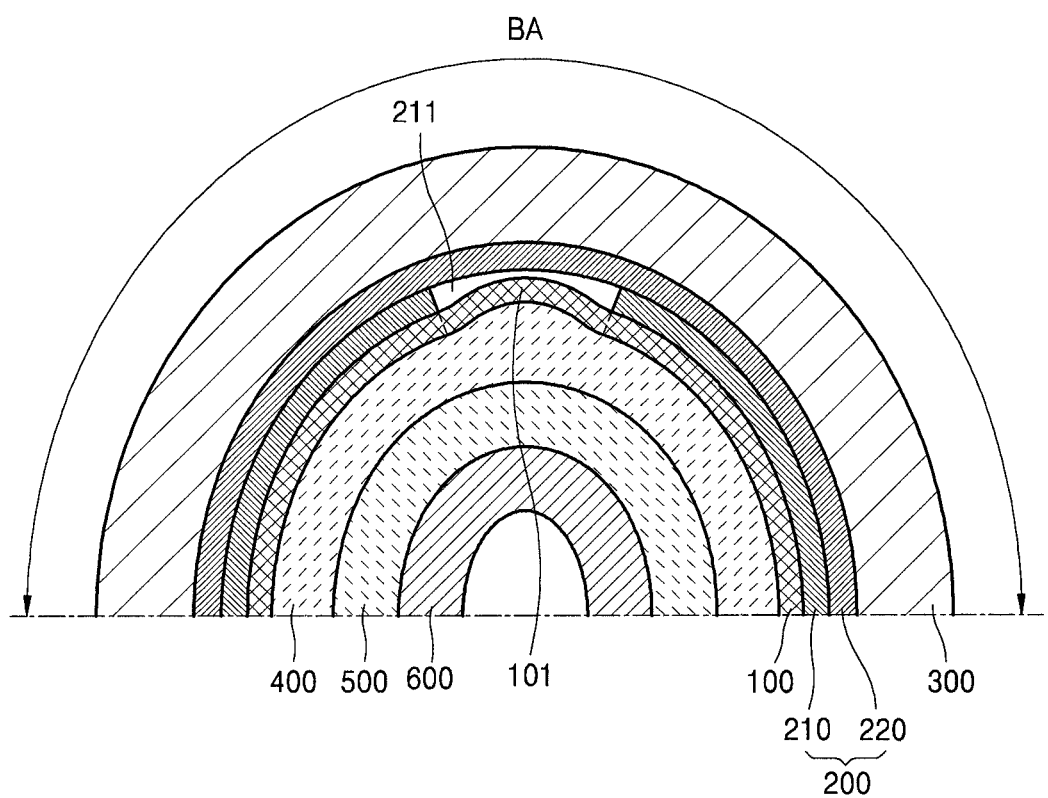

FIGS. 6 and 7 are cross-sectional views of a portion of the flexible display apparatus while not being bent and while being bent, respectively, according to yet another embodiment.

Referring to FIG. 6, the support member 200 may include the base film 220, or may also include the adhesive layer 210 laminated over the base film 220.

The base film 220 may support the display panel 100 inside the cover member 300 (e.g., between the cover member 300 and the display panel 100). The base film 220 may include at least one material selected from a group consisting of polyethylene terephthalate (PET), polyethylene naphthalate (PEN), polyethylene sulfide (PES), and polyethylene (PE). In other words, the base film 220 may include polymeric material that provides good flexibility. The cover member 300 may also be made of the same material as the base film 220.

The adhesive layer 210 may include material having adhesive properties to enable the base film 220 to firmly adhere to the substrate of the display panel 100. In some embodiments, the adhesive layer 210 may include material that is similar to acryl. In FIGS. 6 and 7, the adhesive layer 210 is shown as a single layer, but the adhesive layer 210 may include a multi-layered laminate.

As described above, the adhesive layer 210 may act as a shock absorber, which prevents transmission of external shock to the display panel 100, in addition to the role of adhering the base film 220 to the display panel 100. According to an embodiment, the adhesive layer 210 may include a pressure-sensitive adhesive (PSA).

A portion of the adhesive layer 210, which is at the bending area (BA) of the display panel 100, may include a groove portion 211. One side of the groove portion 211 may be defined by the adhesive layer 210 to be curved away from, or to be occupied by, the display panel 100 at the bending area (BA) when the flexible display apparatus 1000 is bent or folded. The groove portion 211 may extend along the y-direction shown in FIG. 1 (i.e., in a direction parallel to the bending axis (L)).

The groove portion 211 may be a portion of the adhesive layer 210 removed from a side of the adhesive layer 210 in the direction of the thickness of the adhesive layer 210. The groove portion 211 may have various shapes. As a non-limiting example, the groove portion 211 may be shaped as a groove with a lid, as a penetrating hole that penetrates the entire thickness of the adhesive layer 210, or as a space that divides the adhesive layer 210 into two separate areas.

Referring to FIG. 7, the groove portion 211 in the adhesive layer 210 may serve the same role as the space 302 in the cover member 300, as shown in FIGS. 4 and 5. Since the adhesive layer 210 is not in the area of the groove portion 211 where the deformation caused by bending or folding occurs most severely, the stress caused by the deformation of the adhesive layer 210 may be eased. Further, since a portion 101 of the display panel 100 that overlaps the groove portion 211 is not covered by the adhesive layer 210, the stress applied to the display panel 100 also may be reduced.

The cover member 300 is located on the opposite side of the surface where the adhesive layer 210 of the base film 220 is formed. The cover member 300 may be over an entirety of the base film 220. As described above, because the groove portion 211 is formed at the same layer as the adhesive layer 210, and because the groove portion 211 partially reduces the thickness of the support member 200, a portion of the cover member 300 that overlaps the groove portion 211 may be less affected by the deformation caused by bending or folding.

Figure 8:
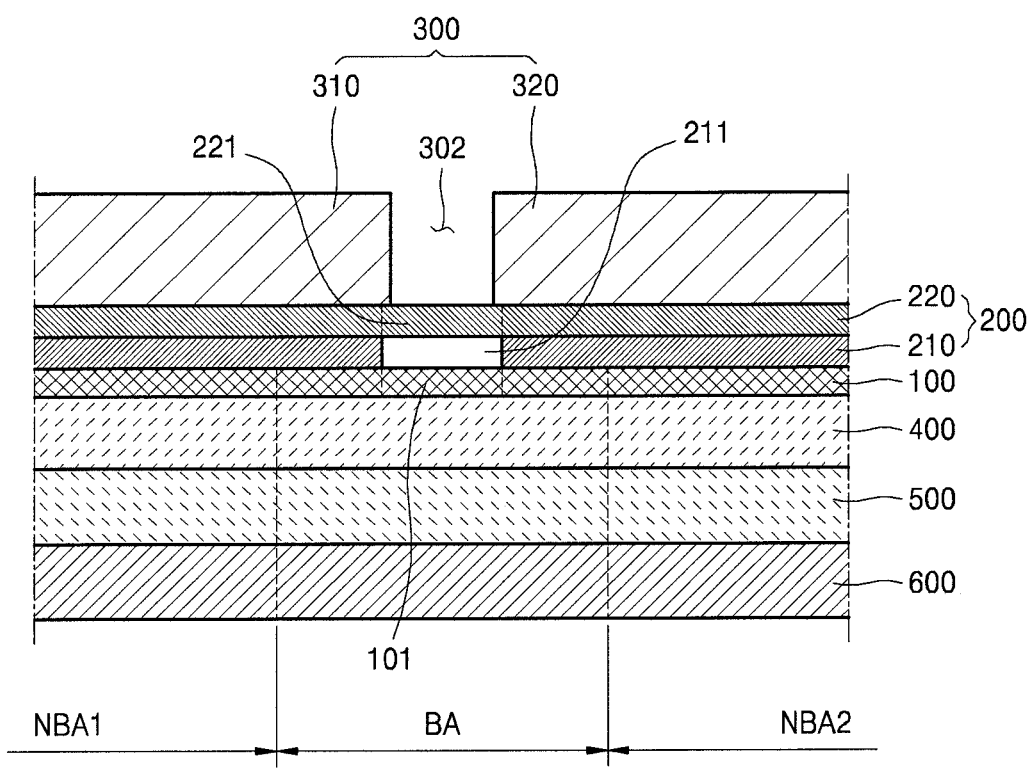
FIGS. 8 and 9 are cross-sectional views of a portion of the flexible display apparatus while not being bent and while being bent, according to a further embodiment.
Figure 9:
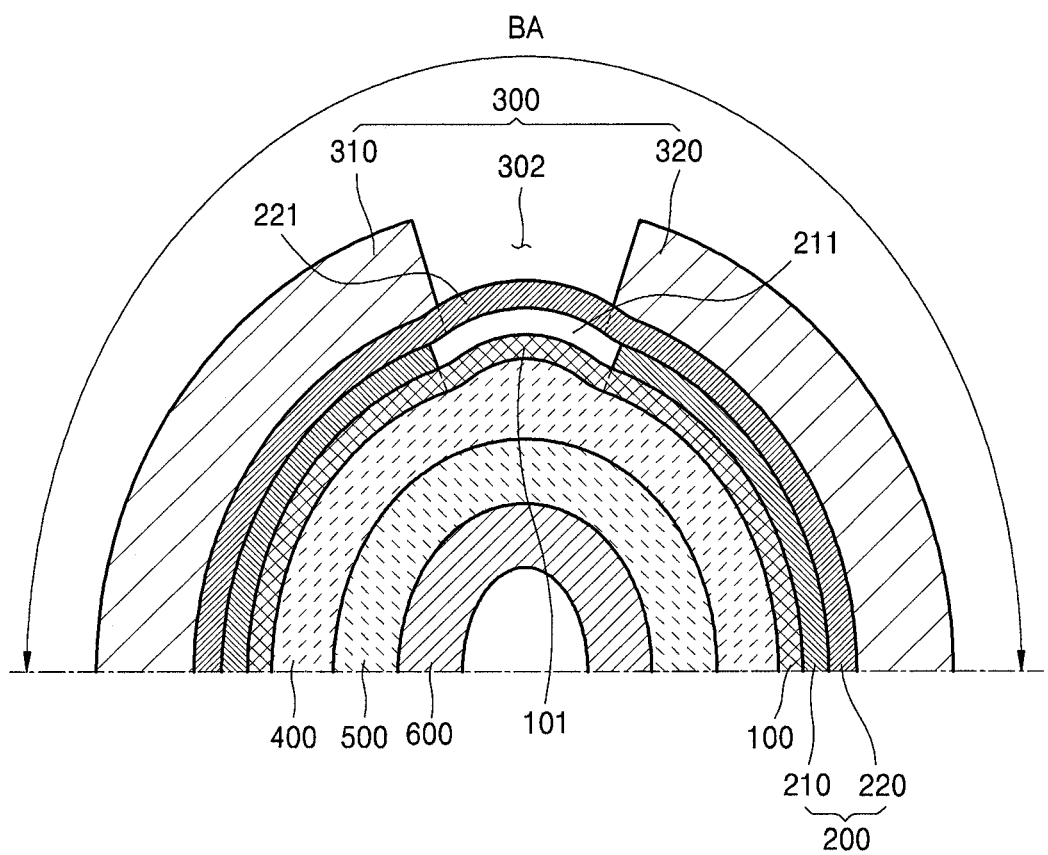

FIGS. 8 and 9 are cross-sectional views of a portion of the flexible display apparatus while not being bent and while being bent, respectively, according to a further exemplary embodiment. Hereinafter, redundant descriptions given hereinbefore with reference to FIGS. 6 and 7 are omitted for convenience of description.

Referring to FIGS. 8 and 9, the support member 200 may include the base film 220 or the adhesive layer 210, which may be laminated over the base film 220. The portion of the adhesive layer 210 that is in the bending area (BA) of the display panel 100 may include the groove portion 211. The groove portion 211 may be defined by the portion 221 of the base film 220 and by the portion 101 of the display panel 100 to be curved away from the display panel 100 in the bending area (BA) of the display panel 100 when the flexible display apparatus 1000 is bent or folded.

However, unlike the previous embodiments described with reference to FIGS. 6 and 7, the cover member 300 may include the first cover member 310, which is at the first non-bending area (NBA1) of the display panel 100, and the second cover member 320, which is at the second non-bending area (NBA2) of the display panel 100. The space 302 may be provided between the first cover member 310 and the second cover member 320. As a result, the groove portion 211 of the support member 200 may overlap the space 302, which is an empty space between the first cover member 310 and the second cover member 320.

Accordingly, at the area of the groove portion 211 and the space 302, where the deformation caused by bending or folding occurs most severely, the stress applied to a portion 221 of the base film 220 that overlaps the groove portion 211 in the support member 200 may be decreased. Further, the stress applied to the portion 101 of the display panel 100 that overlaps the groove portion 211 may also be decreased.

The portion 101 of the display panel 100 and a portion 221 of the base film 220 are configured such that when the device is bent, the shape of the groove portion 211 may similarly bend away from, or may be bowed from, the display panel 100.

Although the embodiments described previously are about the way the display panel 100 may be deformed while being bent or folded curving inward, it is alternately possible for the surface, in which the display unit of the display panel 100 is formed, to bend or fold curving outward. In this case, at least one of the polarizer 500 and the window unit 600 may have a protruding portion toward the window unit 600 away from the display panel 100, or may have the groove portion or the space as described above.

Figure 10:
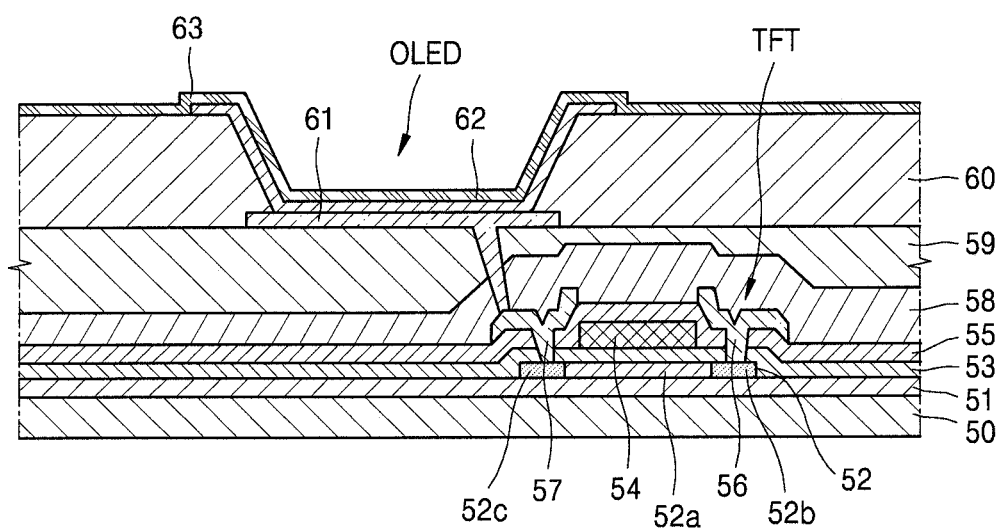
FIG. 10 is a schematic cross-sectional view of a flexible display apparatus according to another embodiment.

FIG. 10 is a schematic cross-sectional view of the flexible display apparatus according to another embodiment. Hereinafter, for convenience, a structure of the display unit will be explained by focusing on the case in which an organic light-emitting diode (OLED) is disposed as the display device.

Referring to FIG. 10, in the case of a flexible OLED display apparatus according to an embodiment, configuring elements may be formed on a substrate 50.

The substrate 50 may include materials that have good flexibility properties. As a non-limiting example, the substrate 50 may include organic materials, such as polyimide, PEN, PET, polyether ether ketone, polyether sulfone, polymethyl methacrylate, polycarbonate and polypropylene. When the substrate 50 includes polyimide, which is fire-resistant and flexible, the substrate 50 may include a transparent flexible substrate.

On the substrate 50, common layers, such as a buffer layer 51, a gate insulation layer 53, and an interlayer insulating layer 55, may be on an entirety of the substrate 50. A patterned semiconductor layer 52, which may include a channel region 52a, a source contact region 52b, and a drain contact region 52c, may be formed. Further, a gate electrode 54, a source electrode 56, and a drain electrode 57, which are components of a thin film transistor (TFT), may be formed together with the patterned semiconductor layer 52.

A protection layer 58, which covers the TFT, and a planarization layer 59, which is on the protection layer 58 with its largely flat upper surface, may be formed over an entirety of the substrate 50. On the planarization layer 59, the OLED may be formed. The OLED may include a patterned pixel electrode 61, an opposite electrode 63 that largely corresponds to the entire surface of the substrate 50, and a multi-layered intermediate layer 62, which is between the pixel electrode 61 and the opposite electrode 63, may include a light-emitting layer.

In another embodiment, some portions of the intermediate layer 62 may be the common layer that largely corresponds to the entire surface of the substrate 50, while other portions thereof may be a patterned layer that corresponds to the pixel electrode 61. The pixel electrode 61 may be connected electrically to the TFT through a via hole in the planarization layer 59 and the protection layer 58. A pixel-defining layer 60 covers the edges of the pixel electrode 61, and has an opening that defines each pixel region. The pixel-defining layer 60 may be formed on the planarization layer 59 such that the pixel-defining layer 60 largely corresponds to the entire surface of the substrate 50.

Such flexible OLED apparatus may be manufactured by using a method of processing a substrate, according to above embodiments.

Further, such a flexible display panel may have tin substance on the other side of the surface on which the display device of the flexible substrate 50 (i.e., OLED) is formed. This is because a substrate is processed after fixing the flexible substrate 50 to a carrier by using an adhesive layer, which includes tin. Herein, the statement that tin is included on the other side of the surface on which the display device of the flexible substrate 50 (i.e., OLED) is formed may be understood to mean that a protective layer is formed on the other side of the surface on which the display device of the flexible substrate 50 (i.e., OLED) is formed, and tin substance is included on the protective layer. This is because, as for the latter, with an end product itself, the protective layer may be regarded as a portion of the flexible substrate 50.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:
1. A flexible display apparatus comprising:
   a display panel comprising:
      a bending area configured to bend or fold around a bending axis; and
      non-bending areas extending from respective edges of the bending area;
   a support member on the display panel across the bending area and the non-bending areas, and comprising an adhesive layer defining a groove at the bending area, and a base layer overlapping the adhesive layer and the groove, a portion of a surface of the base layer defining a portion of the groove and comprising a different material than that of the adhesive layer, and the adhesive layer being located between the base layer and the display panel; and
   a cover member facing the display panel such that at least a portion of the support member is between the display panel and the cover member,
   wherein the display panel is configured to be inserted into the groove when the display panel is bent, and withdrawn from the groove when the display panel is unbent, wherein the groove extends in a direction parallel to the bending axis, wherein a thickness of the groove is substantially equal to a thickness of the adhesive layer, and wherein the adhesive layer is continuously disposed on the non-bending areas.

2. The flexible display apparatus of claim 1, wherein a center of curvature in the bending area when the display panel is bent or folded is closer to the display panel than the support member.

3. The flexible display apparatus of claim 1, wherein the display panel further comprises a display unit therein, and wherein both edges of a surface of the display panel are configured to be bent or folded to face each other.

4. The flexible display apparatus of claim 1, wherein the non-bending areas of the display panel comprise a first non-bending area and a second non-bending area, and wherein the cover member defines a space between a first portion of the cover member at the first non-bending area and a second portion of the cover member at the second non-bending area such that respective top surfaces of the first and second portions of the cover member are separated by the space, and such that respective bottom surfaces of the first and second portions of the cover member are separated by the space.

5. The flexible display apparatus of claim 4, wherein the groove overlaps the space.

6. The flexible display apparatus of claim 1, wherein a first portion of the support member at the bending area is longer than a second portion of the display panel at the bending area in a direction crossing the bending axis.

7. The flexible display apparatus of claim 1, wherein the base layer comprises at least one material selected from a group consisting of polyethylene terephthalate (PET), polyethylene naphthalate (PEN), polyethylene sulfide (PES), and polyethylene (PE).

\* \* \* \* \*